United States Patent [19]

Palara et al.

[11] Patent Number: 5,144,172
[45] Date of Patent: Sep. 1, 1992

[54] DETECTION CIRCUIT OF THE CURRENT IN AN MOS TYPE POWER TRANSISTOR

[75] Inventors: Sergio Palara, Acicastello; Donato Tagliavia, Palermo, both of Italy

[73] Assignee: SGS-Thomson Microelectronics s.r.l., Milan, Italy

[21] Appl. No.: 605,271

[22] Filed: Oct. 30, 1990

[30] Foreign Application Priority Data

Nov. 30, 1989 [IT] Italy ................. 22551 A/89

[51] Int. Cl.[5] ........................... H03K 3/33; H03K 3/01
[52] U.S. Cl. .................................... 307/570; 307/300; 307/544; 307/548; 307/296.7
[58] Field of Search ............. 307/300, 570, 350, 540, 307/544, 546, 547, 548, 296.4, 296.7, 296.8; 323/273, 279, 280

[56] References Cited

U.S. PATENT DOCUMENTS

| | | | |
|---|---|---|---|
| 4,251,743 | 2/1981 | Hareyama | 307/296.7 |
| 4,319,181 | 3/1982 | Wrathall | 307/296.7 |
| 4,587,442 | 5/1986 | Gray et al. | 307/350 |
| 4,750,079 | 6/1988 | Fay et al. | 361/101 |
| 4,820,968 | 4/1989 | Wrathall | 323/316 |
| 4,943,737 | 7/1990 | Guo et al. | 307/296.7 |

FOREIGN PATENT DOCUMENTS 0227149 7/1987 European Pat. Off. .
2186140 8/1987 United Kingdom .

*Primary Examiner*—Stanley D. Miller
*Assistant Examiner*—Sinh Tran
*Attorney, Agent, or Firm*—Griffin, Branigan & Butler

[57] ABSTRACT

A circuit for detecting the current in an MOS type power transistor comprises a detection transistor (T2) connected with its drain and gate in common to the power transistor (T1) and having characteristics such that the current flowing through it is equal to a fraction of the current (I1) flowing through the power transistor (T1). Downstream from the detection transistor (T2) is a comparison transistor (T6, T13) for comparing a first current (I3), which is equal to a fraction of the current flowing through the detection transistor, with a second or reference current (Ig1) having a pre-set value. The comparison transistor (T6, T13) produces a detection signal of the value of the current in the power transistor (I1) in relation to the difference between the first current (I3) and the reference current (Ig1).

18 Claims, 3 Drawing Sheets

DETECTION CIRCUIT OF THE CURRENT IN AN MOS TYPE POWER TRANSISTOR

BACKGROUND

I. Field of the Invention

The present invention relates to a detection circuit of the current in an MOS type power transistor.

II. Prior Art and Other Considerations

In such a device it is necessary to control the output current, e.g., during overload or shortcircuit situations, so as not to destroy the device itself.

It is also necessary to provide for the possibility of having a diagnostic signal when the output current is lower than a pre-set minimum value, e.g., because the output load is disconnected, or of having a diagnostic signal when the output current is higher than a pre-set maximum value.

On the basis of the prior art the control of the output current in an MOS type power transistor exploits the 'current detection' technique to ensure a minimum power dissipation and a minimum voltage drop across the power device.

In the cases wherein the power device consists of n cells, the current in each individual cell is 1/n of the total. With the 'current detection' technique this current may be used to control the current flowing through the entire MOS power device.

A known circuit embodiment for limiting the current flowing through a power transistor according to the 'current detection' technique provides for the use of a detection transistor connected with drain and gate in common to the power transistor and having characteristics such that the current flowing through it is equal to a fraction of the latter's current and of a control circuit which operates in relation to the voltage which is established at its input due to the current flowing through said detection transistor.

The control circuit, according to the known art, comprises a pair of comparators having inputs connected together, with a series of a resistance and of a voltage generator connected between them. As the current flowing through the power transistor and thus through the detection transistor rises, the voltage across the resistance increases until it equals that of the voltage generator. The control circuit then becomes active and controls the common gate of the power transistor and of the detection transistor thus limiting the current flowing through them.

This circuit embodiment can also be used to signal when the current through the power transistor falls below a pre-set threshold value, and in particular to signal when the load is disconnected.

In this case the signal is executed through the output of a comparator one of whose inputs is kept at a constant threshold voltage and the other of whose inputs receives a voltage proportional to the current flowing through the power transistor.

This technique has several disadvantages such as the high number of components, the complexity of accomplishment and a comparatively low and barely controllable degree of accuracy.

The object of the present invention is to accomplish a detection circuit of the current in an MOS type power transistor which has a lower number of components and at the same time is accurate and hardly sensitive to variations in the parameters external to the circuit.

SUMMARY

According to the invention such object is attained with a detection circuit of the current in an MOS type power transistor, comprising a detection transistor connected with drain and gate in common to the power transistor and having characteristics such that the current flowing through it is equal to a fraction of the current flowing through the power transistor, characterized in that it comprises means for comparing a first current equal to a fraction of the current flowing through the detection transistor with a second reference current having a pre-set value and to produce a detection signal of the value of the current in the power transistor in relation to the difference between said first and second current, there being moreover provided means suitable for generating a further reference current of a value such as to ensure the equality of the voltages between the gates and the sources of the power and detection transistors.

In this way, by making the comparison in terms of current rather than of voltage, the number of components is reduced and with it the complexity of the circuit. At the same time a high accuracy is obtained which depends solely on the accuracy, including that for temperature, of the device used to generate the reference current which may be programmed internally.

Advantageously such circuit may be used to control the current flowing through the power transistor, as well as only as a signalling circuit with the function of diagnosing when the current through the power transistor is higher than a maximum threshold value or falls below a pre-set minimum threshold value.

BRIEF DESCRIPTION OF THE DRAWINGS

The features of the present invention shall be made more evident by some embodiments illustrated as a non-limiting example in the enclosed drawings, wherein.

DETAILED DESCRIPTION OF THE DRAWINGS

Figure 1:
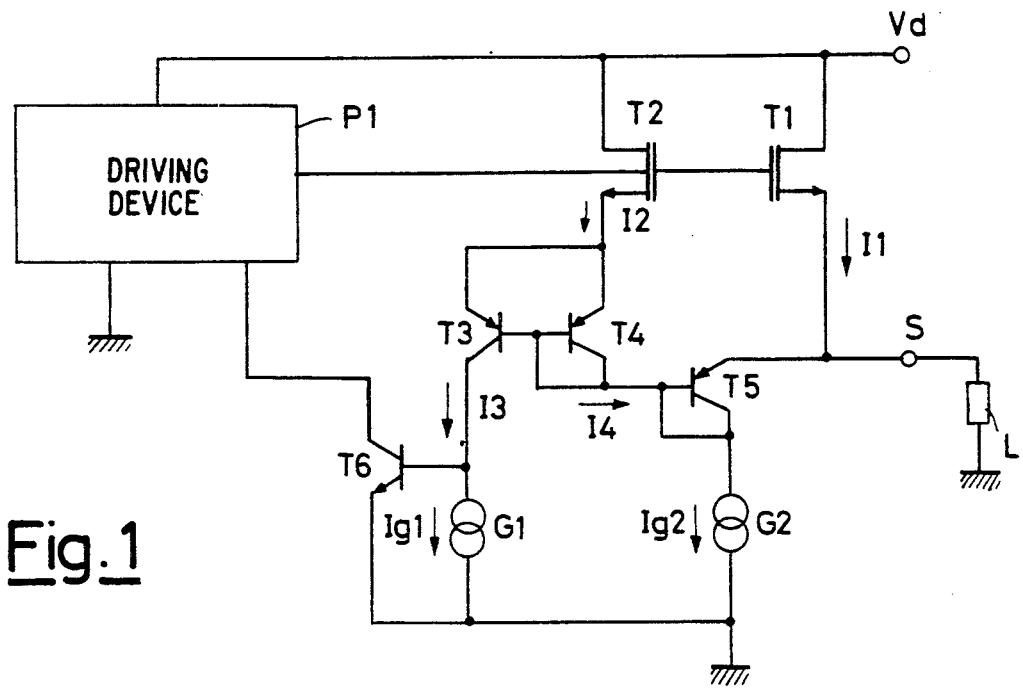
FIGS. 1 and 2 illustrate two embodiments of the detection circuit, used with functions of control, with PNP and NPN transistors, respectively.

With reference to FIG. 1, the illustrated circuit comprises an MOS type power transistor T1, whose drain is connected to a power supply Vd, while the gate is connected to a driving device P1 and the source is connected to a load L at a circuit node S.

With the power transistor T1 there is associated a detection transistor T2 of the MOS type which has characteristics such that the current flowing through it is equal to a fraction of the current flowing through the power transistor. The detection transistor T2 has the drain connected to power supply Vd, the gate connected to the gate of transistor T1 and thus to driving device P1 and the source connected to the emitters of a pair of bipolar transistors T3, T4 of the PNP type arranged as a current mirror with bases connected together. The collector of transistor T4 is connected to the base of the same and to the base of a bipolar transistor T5 of the PNP type. The emitter of transistor T5 is connected to circuit node S and the collector is connected to the base of the same and to ground through a current generator G2. The collector of transistor T3 is connected, on one side, to ground through a current generator G1, on the other side to the base of a bipolar control transistor T6 of the NPN type, whose emitter is grounded and whose collector is connected with functions of control to driving device P1.

With reference to the illustrated circuit, let it be assumed that the current I2 flowing through detection transistor T2 is 1/1000th of the current I1 through power transistor T1. Let it also be assumed that transistor T3 is identical to transistor T4.

Under these conditions current I2 is divided into equal parts I3 and I4 in T3 and T4, so that $I3 = I4 = I2/2$.

Let it be assumed that I1 is to be set at a maximum value I1max. On the basis of the previous relationships, when the current through the power transistor T1 is at its highest value, $I3 = I1max/2000$.

If the current Ig1 of generator G1 is set at a value equal to $I3 = I1max/2000$, when I3 is less than the current of generator G1 transistor T6 is off. As soon as I3 rises above the current of generator G1, transistor T6 is activated and this causes the driving device P1 to control the gate of T1 and T2 so as to set the current in power transistor T1 at the value of I1max.

The current Ig2 of generator G2 is set so that on T5, whose emitter area is identical to that of T4, there flows the same current that passes on T4, so that the base-emitter voltages of T5 and T4 are equal to one another, that is, $Vbe(T5) = Vbe(T4)$, and thus the gate-source voltages of transistors T1 and T2 are also the same, that is, $Vgs(T1) = Vgs(T2)$, so as to have the highest accuracy in the ratio between the currents through transistors T1 and T2.

Figure 2:
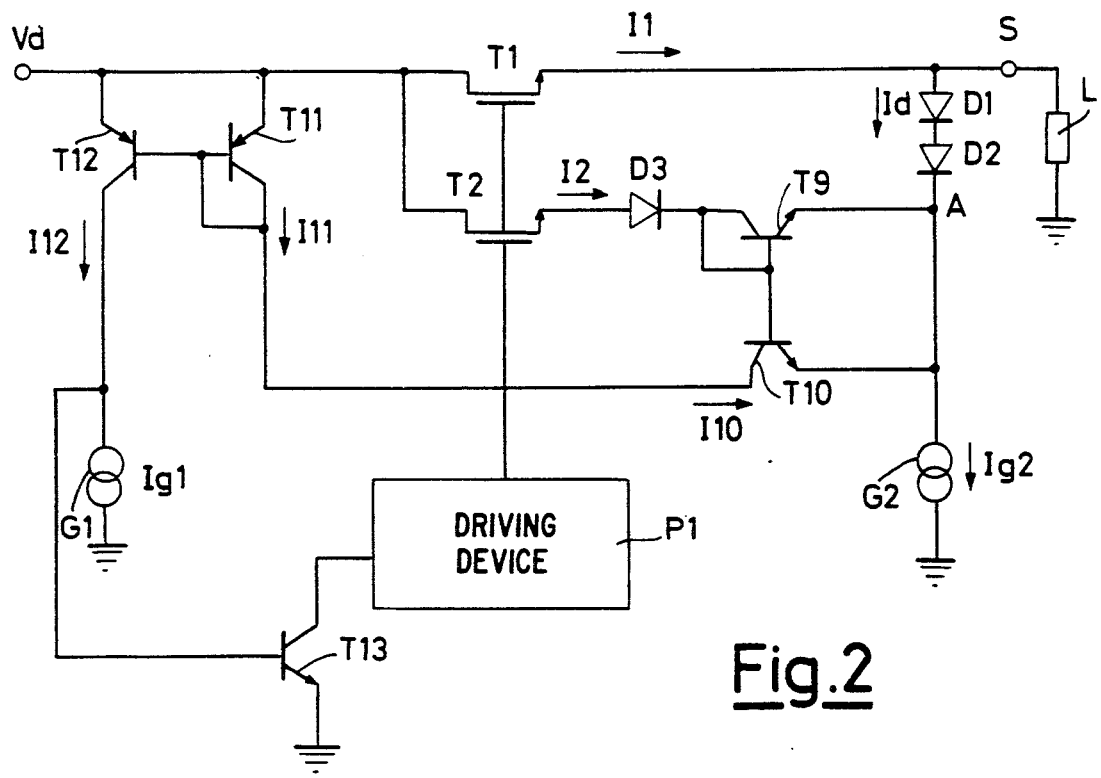

With reference to FIG. 2, an alternative circuit embodiment of the circuit illustrated in FIG. 1 comprises a power transistor T1, whose drain is connected to power supply Vd, while the source is connected to load L at circuit node S and the gate is connected to a driving device P1. With transistor T1 there is associated a detection transistor T2, whose drain is connected to power supply Vd, while the gate is connected to driving device P1 and the source is connected through a diode D3 to the collector of a bipolar transistor T9 of the NPN type, in turn connected to the base of the same. The emitter of transistor T9 is connected to a circuit node A. Between circuit node A and circuit node S there is a series of a diode D2 and of a diode D1. To the base of transistor T9 there is connected the base of a bipolar transistor T10 of the NPN type. The emitter of transistor T10 is connected on one side to circuit node A, on the other side to a ground through a current generator G2. The collector of transistor T10 is connected to the collector of a bipolar transistor T11 of the PNP type, in turn connected to the base of the same; the emitter of transistor T11 is connected to power supply Vd. The base of transistor T11 is connected to the base of a bipolar transistor T12 of the PNP type whose emitter is connected to power supply Vd, while the collector is connected on one side to ground through a current generator G1, on the other to the base of a bipolar transistor T13 of the NPN type. The collector of transistor T13 is connected with functions of control to driving device P1, while the emitter is grounded.

In a manner similar to that described in relation to the operation of the circuit illustrated in FIG. 1, if in power transistor T1 there flows the current I1, in the detection transistor T2 there flows a current $I2 = I1/n$ where n is the ratio between the number of cells of T1 and of T2.

If A9, A10, A11, A12 are the emitter areas of T9, T10, T11, T12, we have: $I2 = I1/n$, $I10 = I2 \times (A10/A9)$, $I11 = I10$, $I12 = (A12/A11) \times I11 = (A12/A11) \times (A10/A9) \times (I1/n)$ so that the normally quenched transistor T13 is brought to conduction, giving rise to the inhibition of power transistor T1 when I12 is greater than or equal to IG1, the current of current generator G1, that is for a current I1 such that $(A12/A11) \times (A10/A9) \times (I1/n)$ is greater than or equal to Ig1 and thus when I1 is greater than or equal to $n \times Ig1 \times (A11/A12) \times (A9/A10)$. If $A12 = A11$, $A9 = 10 \times A10$, $n = 1000$ and $Ig1 = 1$ mA, I1 is roughly equal to 10 A.

With respect to the circuit diagram of FIG. 1, the circuit diagram of FIG. 2 utilises for transistors T9 and T10 the NPN type rather than the PNP. This makes it possible, with equal output currents, to have a Lower ratio of the number of cells of T1 with respect to T2, and thus a greater accuracy in the ratio between the current of transistor T1 and that of detection transistor T2, in view of the greater current delivery, for equal sizes, of the NPN's with respect to the PNP's.

Diodes D1 and D2 are used to obtain a voltage drop at point A (with respect to the source of T1) equal to 2Vbe. This drop is then recovered by the voltage across D3 and by Vce (collector-emitter voltage) of transistor T9.

In this way the sources of transistors T1 and T2 are at about the same potential. Since the Latter also have the gate in common, Vgs, is the same for both transitors, and there is thus a greater accuracy in the ratio between the primary current I1 and the current of detection transistor T2.

Figure 3:
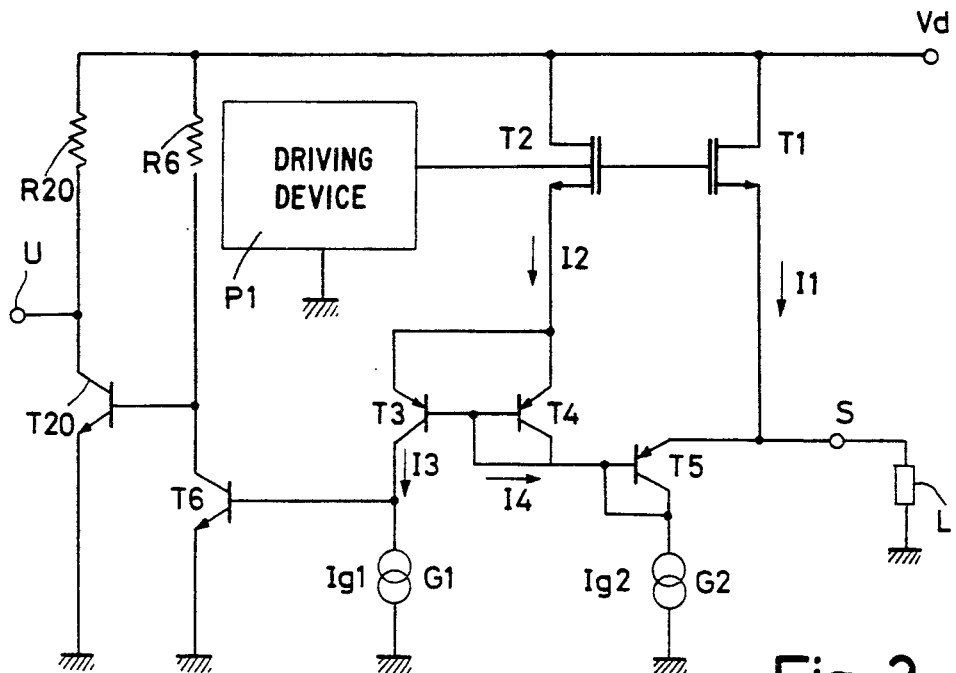
FIGS. 3 and 4 illustrate embodiments of the detection circuit, used with functions of diagnostics, with PNP transistors in FIG. 3 and NPN transistors in FIG. 4, respectively.

There is shown in FIG. 3 a circuit in all respects similar to that of FIG. 1, but used with functions of diagnostics to detect a value of current below a minimum pre-set threshold, in particular a condition of a disconnected Load. Such a circuit differs from that shown in FIG. 1 due to the presence of a further transistor T20 whose base is connected to the collector of transistor T6, while the emitter is grounded, in addition the collectors of both transistors T6, T20 are connected to power supply Vd through respective resistances R6, R20.

The device operates as follows. Once the current Ig1 has been set at a suitably Low value corresponding to the minimum threshold to be detected, when the current I1 in the power transistor falls below said minimum threshold, e.g., due to the Load L being disconnected, current I3, correspondingly, falls below Ig1 and thus causes the quenching of transistor T6, which in turns Leads to the conduction of transistor T20 on whose collector, at an output U, there appears the desired diagnostic signal.

Figure 4:
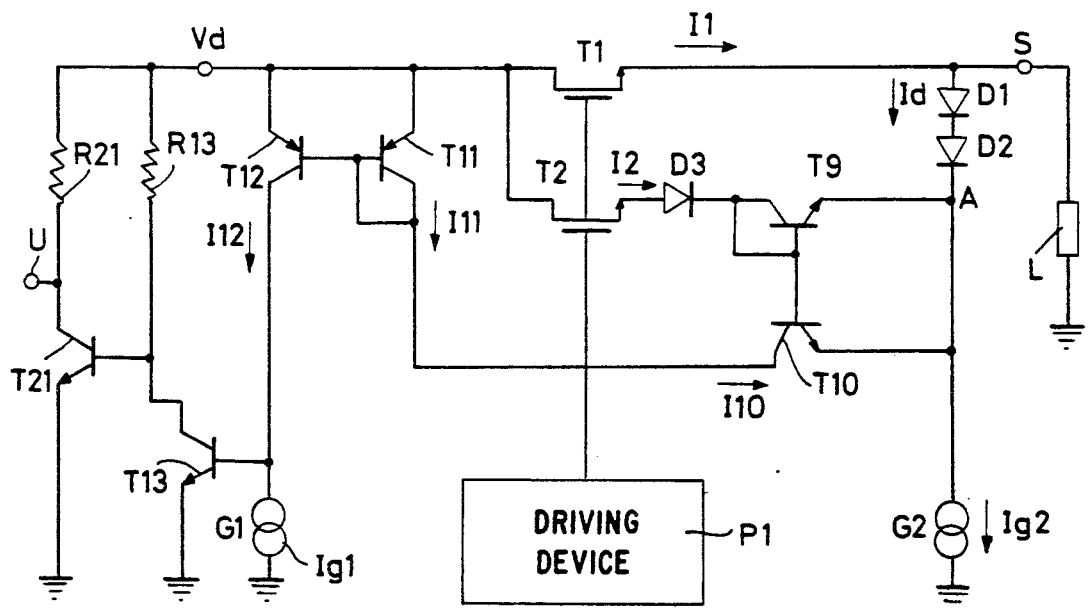

The circuit shown in FIG. 4 is in turn similar to that of FIG. 2, but is used with functions of diagnostics similar to those of FIG. 3. The difference from the circuit of FIG. 2 consists in the presence of a further transistor T21 whose base is connected to the collector of transmistor T13 whose emitter is grounded; in addition the collectors of both transistors T13, T21 are connected to power supply Vd through respective resistances R13, R21.

In a manner similar to what has been said for the circuit of FIG. 3, the current Ig1 is set at a low value corresponding to the minimum threshold desired. When current I1 falls below said threshold I12 in turn falls below Ig1 causing the quenching of T13 and the conduction of T21 on whose output U the diagnostic signal appears.

Figure 5:
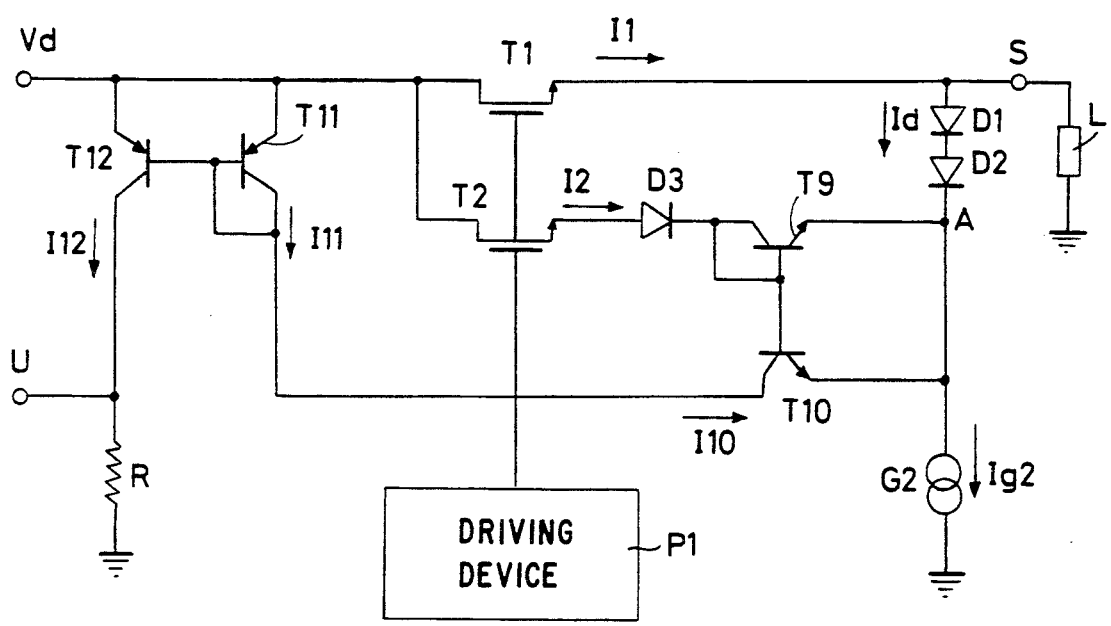
FIG. 5 illustrates an embodiment of the detection circuit, which may be used to regulate the ratio between the firing time and that of quenching of the power transistor.

With reference to FIG. 5, there is shown the circuit of FIGS. 2 and 4 with the exclusion of transmistor T13 and of current generator G1, but with the addition of a resistance R on the collector of transistor T12.

This circuit determines on an output U connected to the collector of transistor T12 a signal proportional to current I1, which can be used to regulate, through the voltage drop across resistance R, the ratio between the firing time and that of quenching of power transistor T1.

We claim:

1. A circuit for detecting the current in a MOS type power transistor, the power transistor having a gate, a drain, and a source; the circuit comprising:

a detection transistor having a gate, a drain, and a source, the drain of the detection transistor being connected to the drain of the power transistor and the gate of the detection transistor being connected to the gate of the power transistor, the detection transistor having a current flowing therethrough equal to a fraction of a current flowing through the power transistor;

comparison means connected to the detection transistor for comparing a first current with a second current and for producing a detection signal of the value of the current in the power transistor in relation to the difference between the first current and the second current, the first current being equal to a fraction of the current flowing through the detection transistor and the second current being a reference current having a pre-set value; and, current generation means connected to the power transistor and to the detection transistor for generating a further reference current of a value which ensures that the voltage between the gate and the source of the power transistor is equal to the voltage between the gate and the source of the detection transistor.

2. The circuit of claim 1, wherein the comparison means comprises a first transistor.

3. The circuit of claim 2, further comprising a second transistor and a third transistor connected to the detection transistor and to each other in a current mirror configuration whereby the current flowing through the detection transistor is mirrored in a third current equal to the first current.

4. The circuit of claim 2, further comprising a driving circuit connected to the gate of the power transistor and to the gate of the detection transistor, and wherein the first transistor controls the driving circuit for applying a gate voltage to the power transistor and to the detection transistor.

5. The circuit of claim 2, further comprising a further transistor connected to the first transistor, and wherein the first transistor controls the further transistor for providing a diagnostic signal related to the current in the power transistor.

6. A circuit for detecting the current in a Mos type power transistor, the power transistor having a gate, a drain, and a source; the circuit comprising:

a detection transistor having a gate, a drain, and a source, the drain of the detection transistor being connected to the drain of the power transistor and the gate of the detection transistor being connected to the gate of the power transistor, the detection transistor having a current flowing therethrough equal to a fraction of a current flowing through the power transistor;

current generation means for generating a reference current having a pre-set value;

comparison means connected to the detection transistor and to the current generation means for comparing a first current with a second current and for producing a detection signal of the value of the current in the power transistor in relation to the difference between the first current and the second current, the first current being equal to a fraction of the current flowing through the detection transistor, the second ocurrent being the reference current generated by the current generation means; and, further current generation means connected to the power transistor and to the detection transistor for generating a further reference current of a value which ensures that the voltage between the gate and the source of the power transistor is equal to the voltage between the gate and the source of the detection transistor.

7. The circuit of claim 6, further comprising a second transistor and a third transistor connected to the detection transistor and to each other in a current mirror configuration whereby the current flowing through the detection transistor is mirrored in a third current equal to the first current.

8. The circuit of claim 6, further comprising a driving circuit connected to the gate of the power transistor and to the gate of the detection transistor, and wherein the first transistor controls the driving circuit for applying a gate voltage to the power transistor and to the detection transistor.

9. The circuit of claim 6, further comprising a ninth transistor connected to the first transistor, and wherein the first transistor controls the further, transistor for providing a diagnostic signal related to the current in the power transistor.

10. A circuit for detecting the current in a MOS type power transistor, the power transistor having a gate, a drain, and a source; the circuit comprising:

a detection transistor having a gate, a drain, and a source, the drain of the detection transistor being connected to the drain of the power transistor and the gate of the detection transistor being connected to the gate of. the power transistor, the detection transistor having a current flowing therethrough equal to a fraction of a current flowing through the power transistor;

comparison means connected to the detection transistor for comparing a first current with a second current and for producing a detection signal of the value of the current in the power transistor in relation to the difference between the first current and the second current, the first current being equal to a fraction of the current flowing through the detection transistor and the second current being a reference current having a pre-set value;

current generation means connected to the power transistor and to the detection transistor for generating a further reference current of a value which ensures that the voltage between the gate and the source of the power transistor is equal to the voltage between the gate and the source of the detection transistor; and, a transistor connected in series with the power transistor and with the current generation means which generates the further reference current.

11. A circuit for detecting the current in a MOS type power transistor, the power transistor having a gate, a drain, and a source; the circuit comprising:

a detection transistor having a gate, a drain, and a source, the drain of the detection transistor being connected to the drain of the power transistor and the gate of the detection transistor being connected to the gate of the power transistor, the detection transistor having a current flowing therethrough equal to a fraction of a current flowing through the power transistor;

comparison means connected to the detection transistor for comparing a first current with a second current and for producing a detection signal of the value of the current in the power transistor in relation to the difference between the first current and the second current, the first current being equal to a fraction of the current flowing through the detection transistor and the second current being a reference current having a pre-set value; and, current generation means connected to the power transistor and to the detection transistor for generating a further reference current of a value which ensures that the voltage between the gate and the source of the power transistor is equal to the voltage between the gate and the source of the detection transistor; and, a diode connected to the detection transistor, the diode having a cathode connected to a collector and a base of a first transistor, the first transistor having its base connected to a base of a second transistor, the sixth transistor being connected to a third transistor in a branch which is parallel to the detection transistor, the third transistor having a base connected to a base of an fourth transistor.

12. A circuit for detecting the current in a MOS type power transistor, the power transistor having a gate, a drain, and a source; the circuit comprising:

a detection transistor having a gate, a drain, and a source, the drain of the detection transistor being connected to the drain of the power transistor and the gate of the detection transistor being connected to the gate of the power transistor, the detection transistor having a current flowing I2 therethrough equal to a fraction of a current I1 flowing through the power transistor;

reference current generating means for generating a first reference current Ig1 having a pre-set value;

comparison means connected to the detection transistor and to the reference current generating means for comparing a first current I3 with the reference current Ig1 and for producing a detection signal in accordance with the comparison, the first current I3 being equal to a fraction of the current I2 flowing through the detection transistor and the current Ig1;

further reference current generation means connected to the power transistor and to the detection transistor for generating a further reference current Ig2 of a value which ensures that the voltage between the gate and the source of the power transistor is equal to the voltage between the gate and the source of the detection transistor.

13. The circuit of claim 12, wherein the comparison means comprises a first transistor.

14. The circuit of claim 12, further comprising a transistor T3 and a transistor T4 connected to the detection transistor and to each other in a current mirror configuration whereby the current I2 flowing through the detection transistor is mirrored in a third current I4 equal to the first current I3.

15. The circuit of claim 12, further comprising a diode connected to the detection transistor, the diode having a cathode connected to a collector and a base of a transistor T9, the transistor T9 having its base connected to a base of a transistor T10, the transistor T10 being connected to a transistor T11 in a branch which is parallel to the detection transistor, the transistor T11 having a base connected to a base of an transistor T12.

16. The circuit of claim 12, further comprising a transistor T21 connected to the first transistor, and wherein the first transistor controls the transistor T21 for supplying a diagnostic signal related to the current in the power transistor.

17. The circuit of claim 12, further comprising means for using the detection signal to control the current in the power transistor.

18. The circuit of claim 12, further comprising electrical driving means, the electrical driving means being connected to the comparison means, to the gate of the detection transistor, and to the gate of the power transistor, wherein the electrical driving means uses the detection signal to control the current in the power transistor.

* * * * *